(12) United States Patent
Harada

(10) Patent No.: US 12,720,816 B2
(45) Date of Patent: Aug. 25, 2026

(54) SEMICONDUCTOR DEVICE

(71) Applicant: Mitsubishi Electric Corporation, Tokyo (JP)

(72) Inventor: Tatsuo Harada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 378 days.

(21) Appl. No.: 18/500,932

(22) Filed: Nov. 2, 2023

(65) Prior Publication Data

US 2024/0243166 A1 Jul. 18, 2024

(30) Foreign Application Priority Data

Jan. 13, 2023 (JP) ................................ 2023-003473

(51) Int. Cl.
*H10D 62/10* (2025.01)
*H10D 8/00* (2025.01)
(Continued)

(52) U.S. Cl.
CPC ........... *H10D 62/109* (2025.01); *H10D 8/422* (2025.01); *H10D 12/038* (2025.01); *H10D 12/481* (2025.01); *H10D 62/393* (2025.01); *H10D 84/617* (2025.01); *H10P 30/204* (2026.01); *H10P 30/21* (2026.01); *H10P 32/1406* (2026.01); *H10P 32/171* (2026.01)

(58) Field of Classification Search
CPC ... H10D 62/109; H10D 12/038; H10D 12/461
See application file for complete search history.

(56) References Cited

U.S. PATENT DOCUMENTS

2018/0138299 A1 5/2018 Naito
2019/0148532 A1 5/2019 Naito
(Continued)

FOREIGN PATENT DOCUMENTS

JP 2003-008017 A 1/2003
JP 2019-110297 A 7/2019
(Continued)

OTHER PUBLICATIONS

An Office Action, "Notice of Reasons for Refusal," mailed by the Japanese Patent Office on Nov. 4, 2025, which corresponds to Japanese Patent Application No. 2023-003473 and is related to U.S. Appl. No. 18/500,932; with English language translation.

*Primary Examiner* — Yu-Hsi D Sun
(74) *Attorney, Agent, or Firm* — Studebaker Brackett PLLC

(57) ABSTRACT

A trench gate type semiconductor device is provided with an active region that is a region where an $n^+$-type emitter layer is provided adjacent to a trench and a thinned region that is a region where the $n^+$-type emitter layer is not provided adjacent to the trench. In the active region, a first n-type carrier accumulation layer is provided as a carrier accumulation layer. In the thinned region, a second n-type carrier accumulation layer having a lower impurity concentration than the first n-type carrier accumulation layer is provided as the carrier accumulation layer. A $p^+$-type contact layer in the thinned region has a portion in contact with an emitter electrode.

7 Claims, 16 Drawing Sheets

(51) Int. Cl.

| | |
|---|---|
| ***H10D 12/00*** | (2025.01) |
| ***H10D 12/01*** | (2025.01) |
| ***H10D 62/17*** | (2025.01) |
| ***H10D 84/60*** | (2025.01) |
| ***H10P 30/20*** | (2026.01) |
| ***H10P 32/10*** | (2026.01) |
| ***H10P 32/14*** | (2026.01) |

(56) References Cited

U.S. PATENT DOCUMENTS

| | | | | |
|---|---|---|---|---|
| 2019/0189772 | A1 | 6/2019 | Leendertz et al. | |
| 2023/0038712 | A1* | 2/2023 | Harada | H10D 8/422 |
| 2023/0261097 | A1 | 8/2023 | Noguchi et al. | |
| 2024/0282845 | A1* | 8/2024 | Ohi | H10D 12/481 |

FOREIGN PATENT DOCUMENTS

| | | | |
|---|---|---|---|
| JP | 2021-184499 | A | 12/2021 |
| JP | 2022-136213 | A | 9/2022 |
| JP | 2023-001343 | A | 1/2023 |
| WO | 2018/105729 | A1 | 6/2018 |
| WO | 2022/244802 | A1 | 11/2022 |

* cited by examiner

F I G. 3
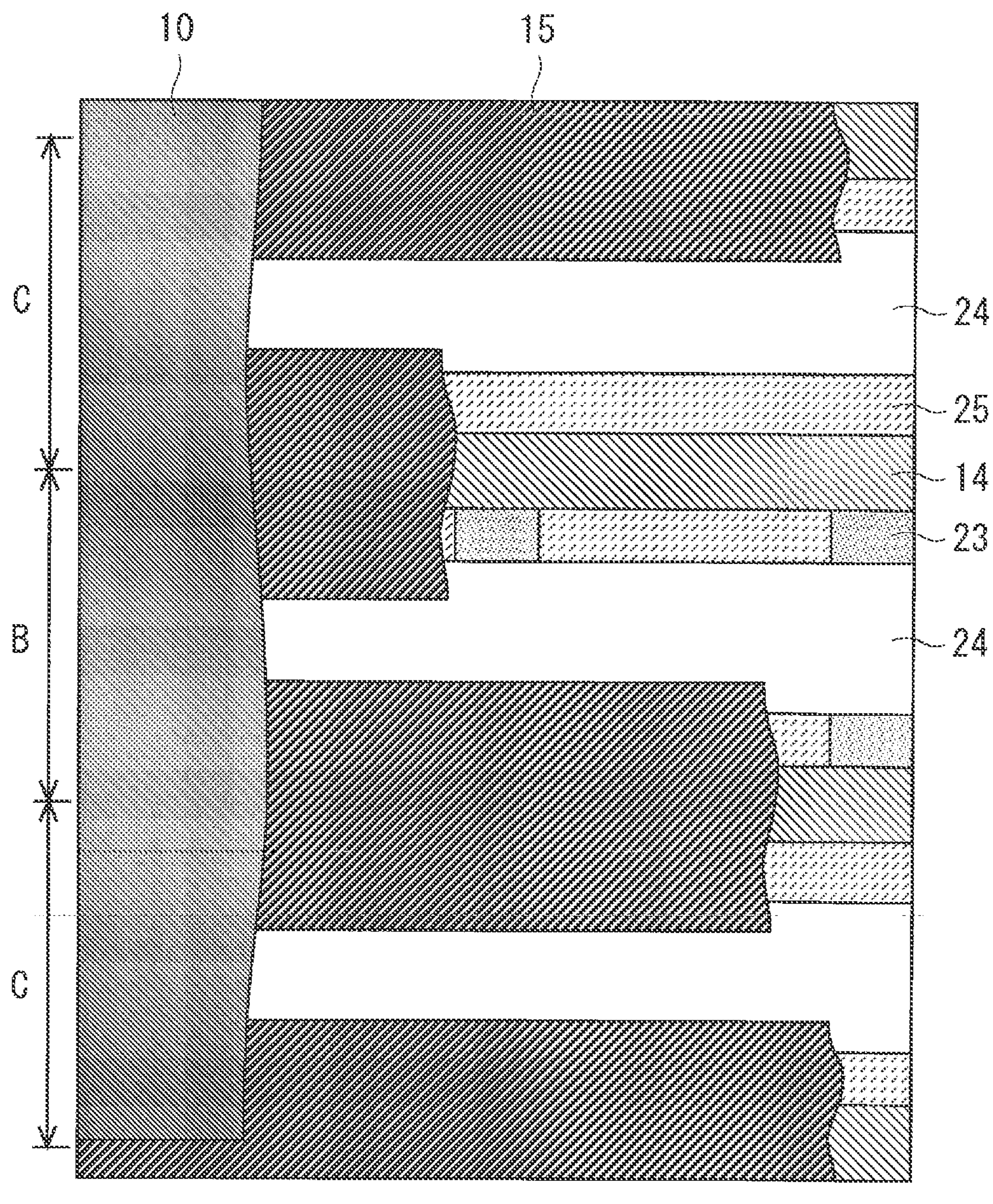

F I G. 4
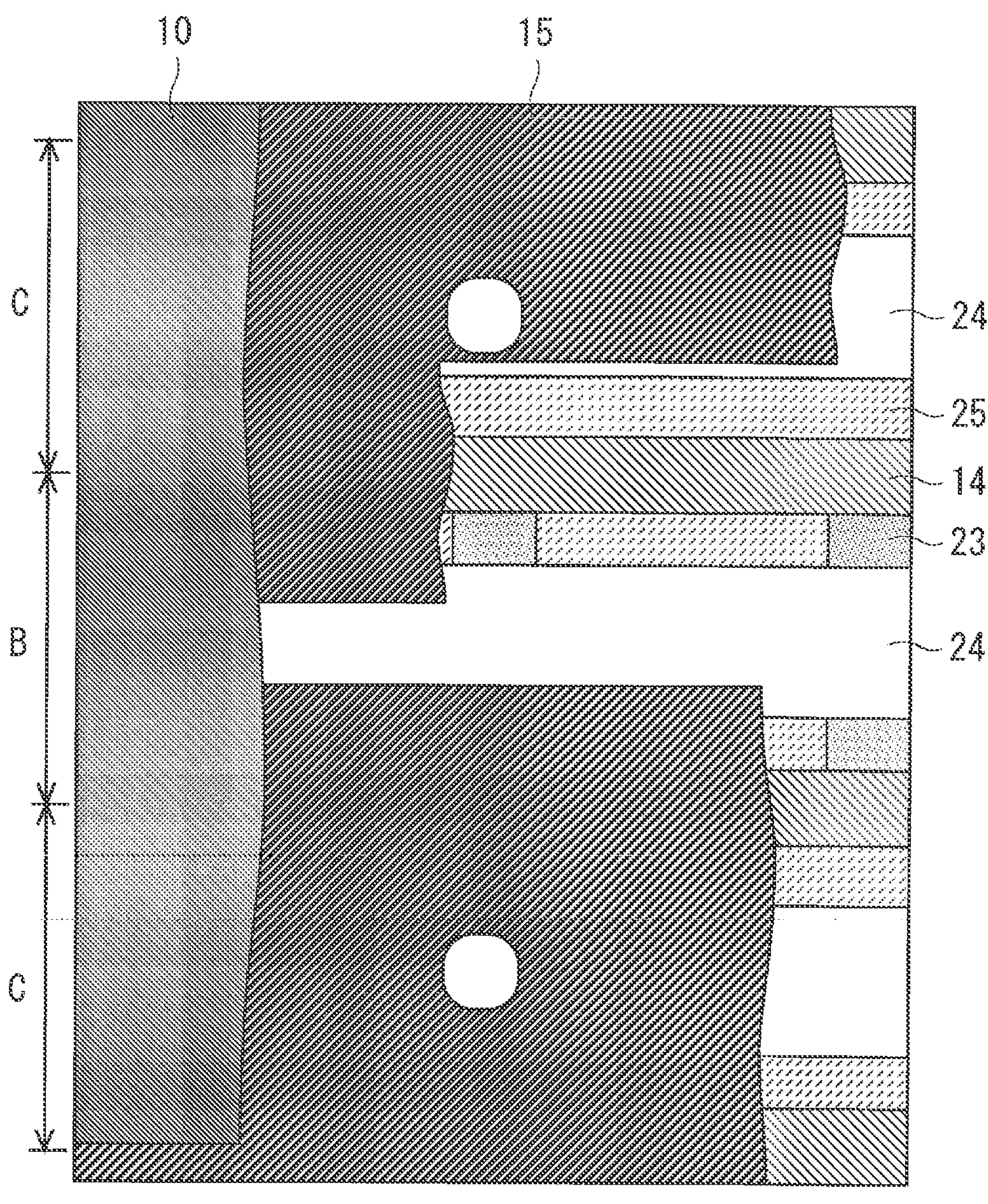

F I G. 5
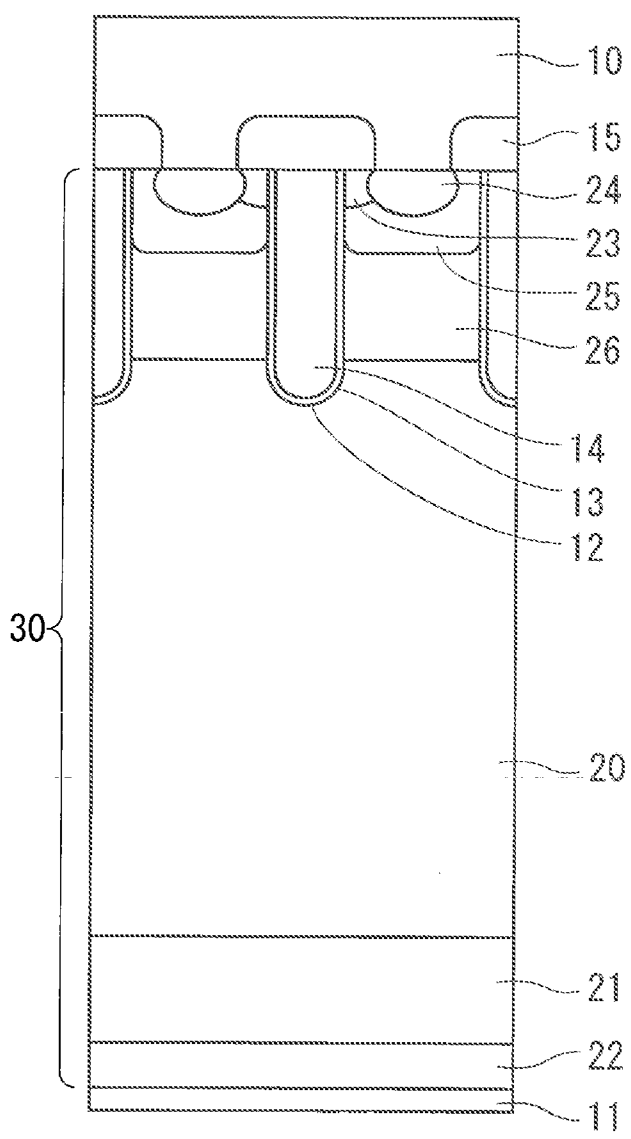

F I G. 8
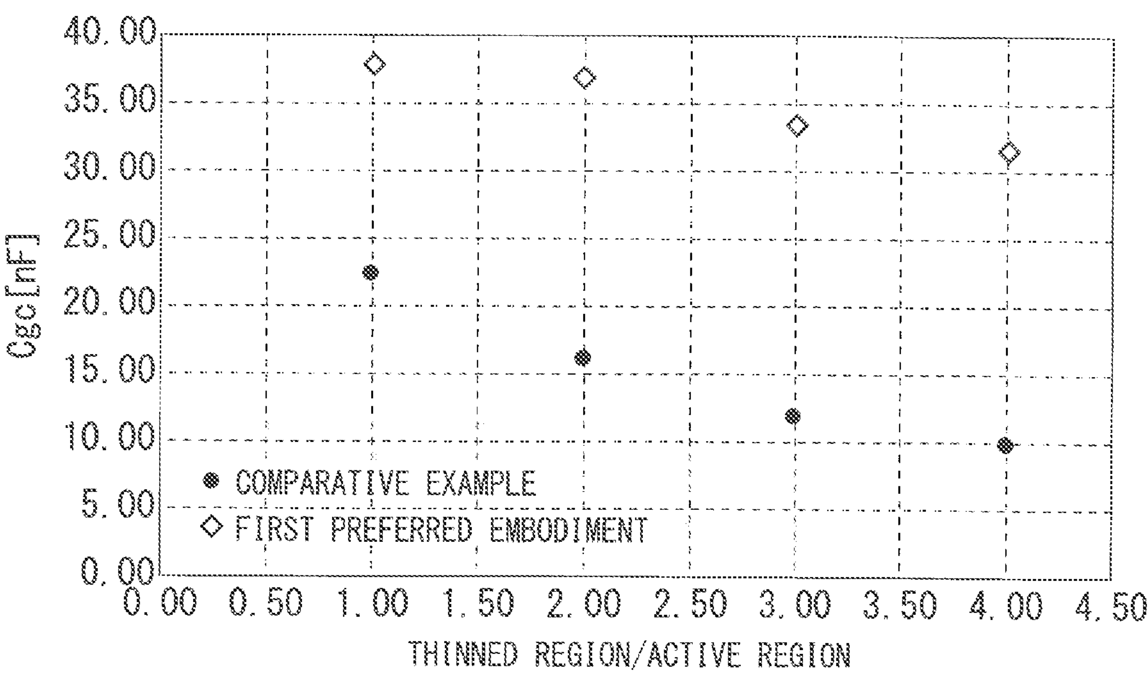

F I G. 9
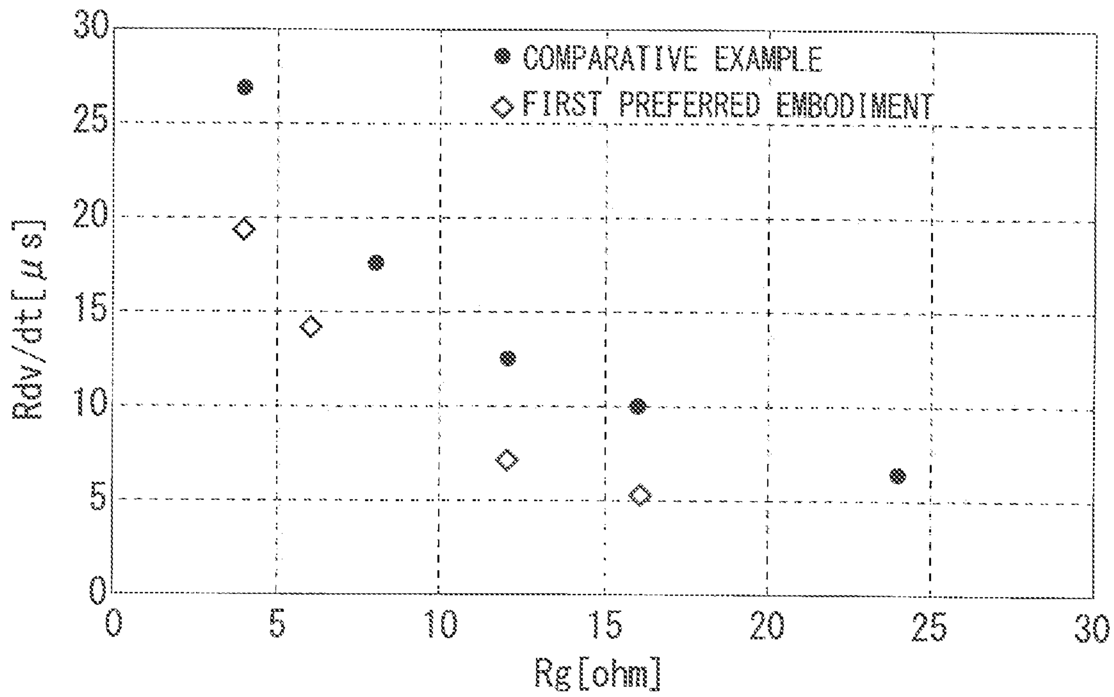

F I G. 1 2
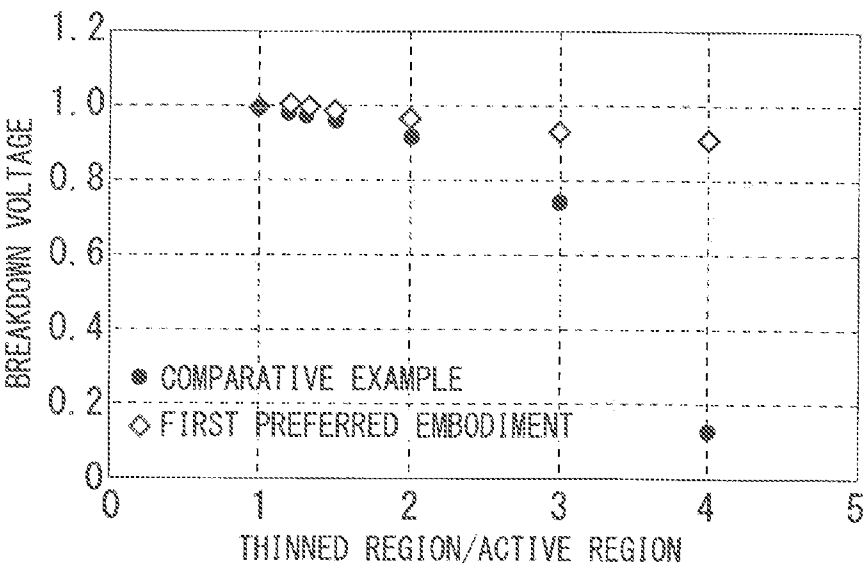

F I G. 1 3
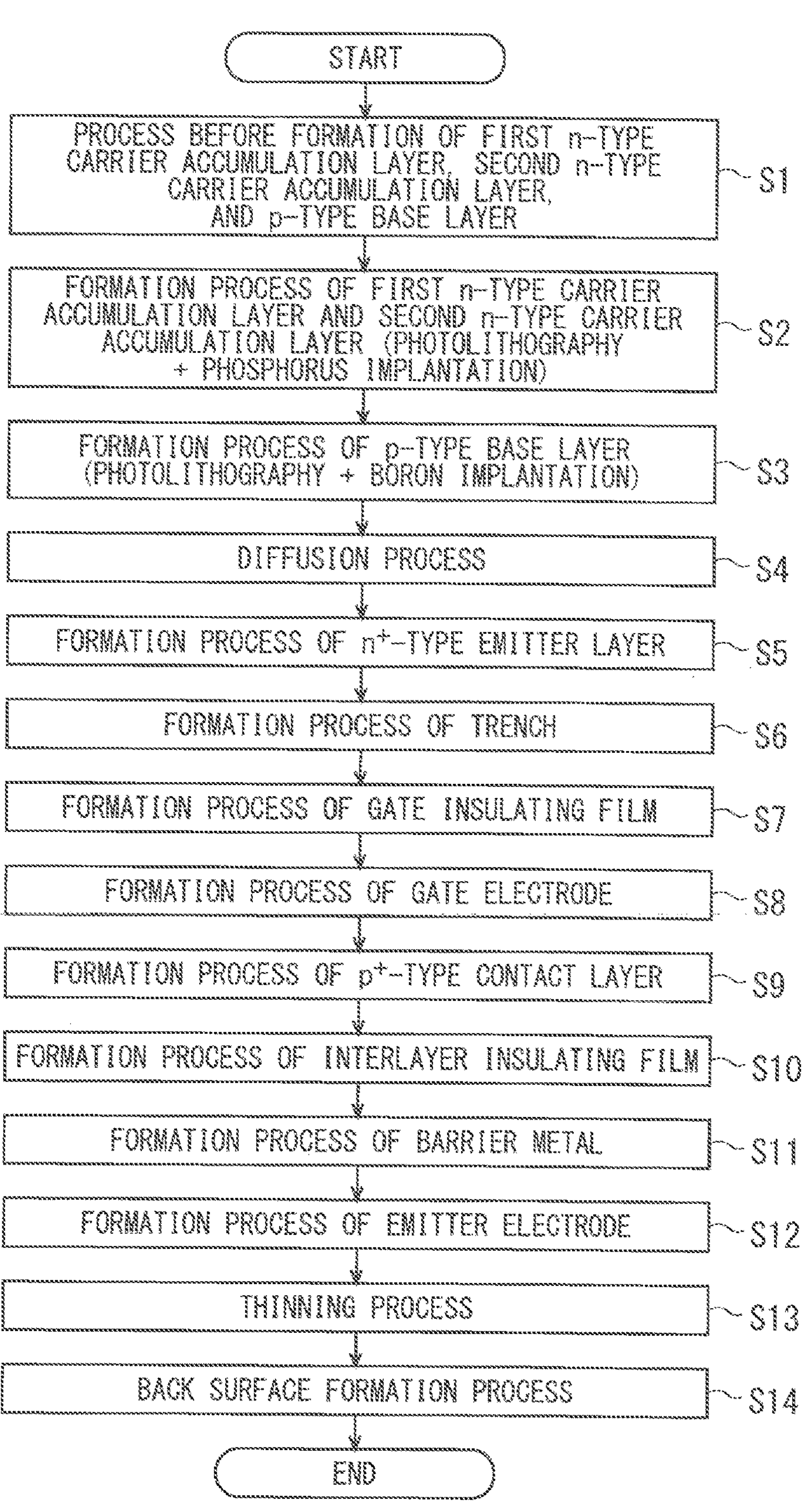

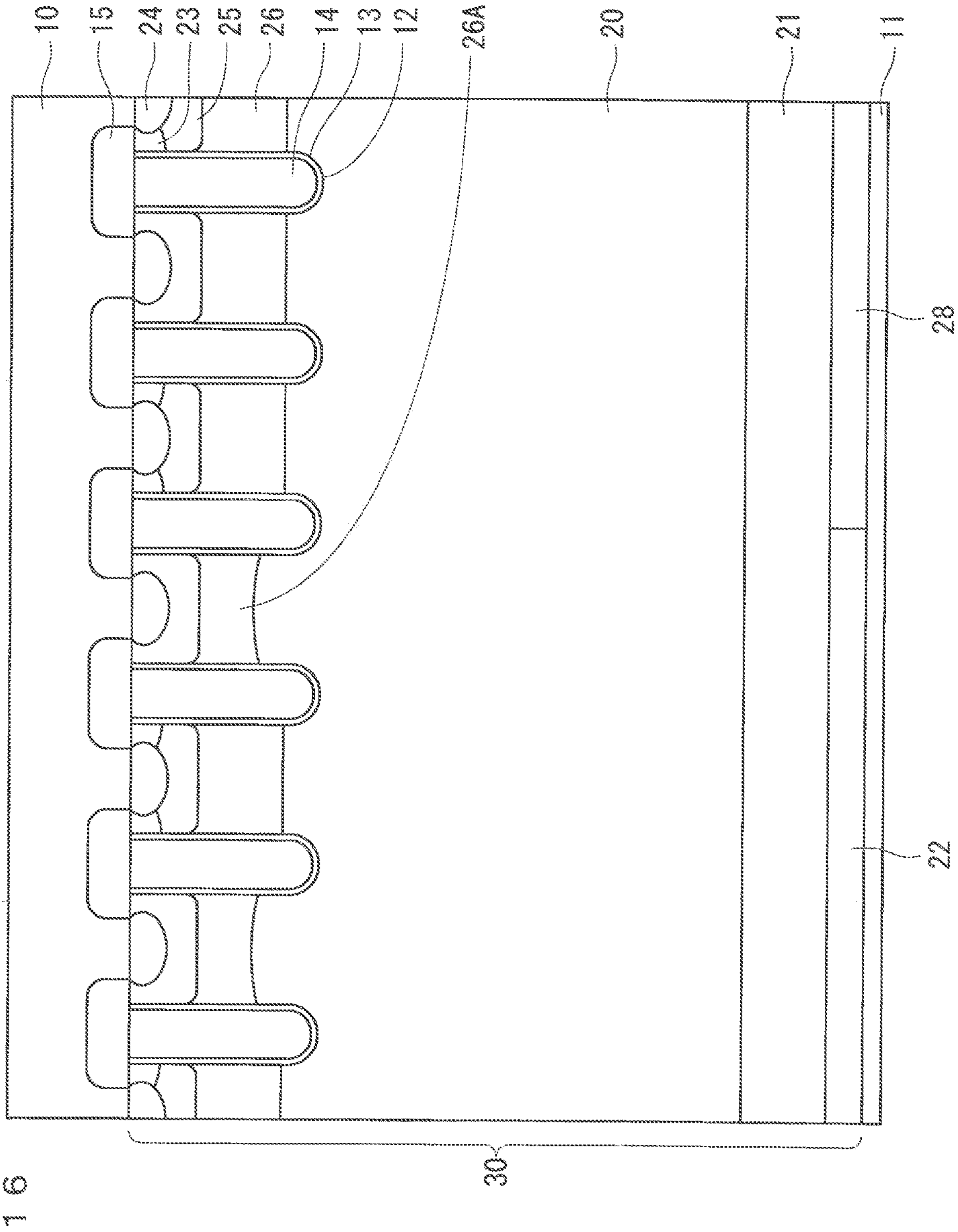
10
15
24
23
25
26
14
13
12
26A
20
21
11
28
22
30
F I G. 16

SEMICONDUCTOR DEVICE

BACKGROUND OF THE INVENTION

Field of the Invention

The present disclosure relates to a semiconductor device, and particularly to a trench gate type semiconductor device including a carrier accumulation layer.

Description of the Background Art

When a carrier accumulation layer is provided in a semiconductor device including a trench gate type insulated gate bipolar transistor (IGBT), a dummy trench in which a gate electrode for controlling an energizing current is not provided is often disposed in the semiconductor device. Hereinafter, in a semiconductor device including an IGBT, a region that functions as an IGBT is referred to as an "active region", and a region that does not function as an IGBT in which a dummy trench is disposed is referred to as a "thinned region".

WO 2018/105729 A discloses a semiconductor device having a structure in which a multi-stage carrier accumulation layer is provided in an active region and a single-stage carrier accumulation layer is provided in a thinned region. In addition, Japanese Patent Application Laid-Open No. 2019-110297 discloses a semiconductor device including a first mesa that is an active region and a second mesa that is a thinned region.

In general, the dummy trenches are provided for the purpose of controlling an energizing current and a parasitic capacitance. The magnitude of the energizing current can be controlled by electrically connecting at least a part of the electrode in the dummy trench to the emitter electrode. However, since the gate-emitter capacitance (Cge) increases, the gate-collector capacitance (Cgc) decreases, and the ratio (Cgc/Cge) decreases, the turn-on speed of the IGBT increases, and as a result, the voltage change speed (dv/dt) of the freewheeling diode increases. In the conventional semiconductor device, in order to suppress dv/dt of the freewheeling diode, it is necessary to sacrifice turn-on characteristics of the IGBT.

SUMMARY

An object of the present disclosure is to provide a semiconductor device capable of suppressing a decrease in Cgc/Cge while suppressing deterioration of characteristics.

A semiconductor device according to the present disclosure includes a semiconductor substrate having a first main surface and a second main surface opposite to the first main surface. A drift layer of a first conductivity type is provided between the first main surface and the second main surface of the semiconductor substrate. A base layer of a second conductivity type is provided in a surface portion of the semiconductor substrate on the first main surface side. A carrier accumulation layer of the first conductivity type having a higher impurity concentration than the drift layer is provided between the base layer and the drift layer. An emitter layer of the first conductivity type is selectively provided in a surface portion of the base layer on the first main surface side. A contact layer of the second conductivity type having a higher impurity concentration than the base layer is selectively provided in the surface portion of the base layer on the first main surface side. A trench that penetrates the base layer and the carrier accumulation layer to reach the drift layer is formed in the first main surface of the semiconductor substrate. A gate insulating film is provided in an inner surface of the trench. A gate electrode embedded in the trench is provided on the gate insulating film. An emitter electrode electrically connected to the emitter layer and the contact layer is provided on the first main surface of the semiconductor substrate. A collector layer of the second conductivity type is provided in a surface portion of the semiconductor substrate on the second main surface side. A collector electrode electrically connected to the collector layer is provided on the second main surface of the semiconductor substrate. An active region is a region where the emitter layer is provided adjacent to the trench. A thinned region is a region where the emitter layer is not provided adjacent to the trench. In the active region, a first carrier accumulation layer is provided as the carrier accumulation layer. In the thinned region, a second carrier accumulation layer having a lower impurity concentration than the first carrier accumulation layer is provided as the carrier accumulation layer. The contact layer in the thinned region has a portion in contact with the emitter electrode.

According to the semiconductor device of the present disclosure, it is possible to suppress a decrease in Cgc/Cge while suppressing deterioration of characteristics.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIGS. 3 and 4 are diagrams showing an arrangement example of a contact hole provided in an interlayer insulating film;

FIG. 5 is a cross-sectional view showing a semiconductor device according to a comparative example;

FIG. 8 is a diagram showing a relationship between a ratio between the active region and the thinned region (thinned region/active region) and Cgc;

FIG. 9 is a diagram showing a relationship between a gate resistance value in a turn-on characteristic of an IGBT and dv/dt in a recovery characteristic of a freewheeling diode;

FIG. 12 is a diagram showing a relationship between a ratio between the active region and the thinned region (thinned region/active region) and a breakdown voltage;

FIG. 13 is a flowchart showing an example of a method of manufacturing the semiconductor device according to the first preferred embodiment;

FIG. 16 is a diagram showing a configuration of a semiconductor device according to a fourth preferred embodiment.

DESCRIPTION OF THE PREFERRED EMBODIMENTS

First Preferred Embodiment

Hereinafter, conductivity types of a semiconductor will be described by assuming that a first conductivity type is an n-type and a second conductivity type is a p-type, but conversely, the first conductivity type may be the p-type and the second conductivity type may be the n-type. In addition, an n-type having a relatively high impurity concentration is denoted as "$n^+$", an n-type having a relatively low impurity concentration is denoted as "$n^-$", a p-type having a relatively high impurity concentration is denoted as "$p^+$", and a p-type having a relatively low impurity concentration is denoted as "$p^-$". Here, the degree of the impurity concentration of each region is defined by the peak concentration. That is, the region where the impurity concentration is high (low) means a region where the peak concentration of the impurity concentration is high (low).

Figure 1:
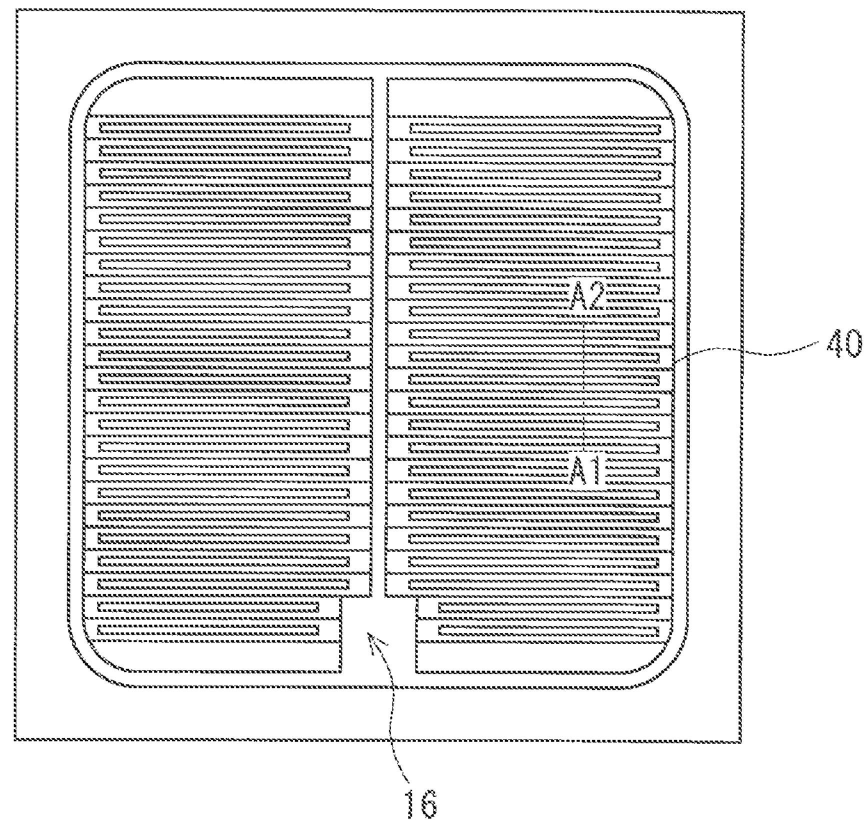
FIG. 1 is a plan view showing a semiconductor device according to a first preferred embodiment.

FIG. 1 is a plan view showing a semiconductor device according to a first preferred embodiment. As shown in FIG. 1, the semiconductor device includes a cell region 40 through which a main current flows, and a pad region 16 that is a region where a gate pad for inputting a control signal of the semiconductor device is disposed, the cell region 40 being a region where a cell of a semiconductor element through which the main current flows is formed. Note that, in FIG. 1, illustration of an electrode provided on the upper surface of the semiconductor device, for example, the above-described gate pad, a main electrode provided on the cell region 40, and the like is omitted, and the upper surface structure of the semiconductor layer is shown.

The outside of the combined region of the pad region 16 and the cell region 40 is a termination region for maintaining the withstand voltage of the semiconductor device. An arbitrary withstand voltage maintaining structure is provided in the termination region. Examples of the withstand voltage maintaining structure include a field limiting ring (FLR) having a configuration in which the cell region 40 is surrounded by a ring-shaped p-type termination well layer, a variation of lateral doping (VLD) having a configuration in which the cell region 40 is surrounded by a ring-shaped p-type termination well layer with a gradient of impurity concentration, and the like in a surface portion on a first main surface side that is the front surface of the semiconductor device. The number of ring-shaped p-type termination well layers used for FLR and the impurity concentration distribution of the ring-shaped p-type termination well layers used for VLD are appropriately selected according to the withstand voltage design of the semiconductor device.

A gate drive voltage for controlling switching between on and off of the semiconductor device is applied as a control signal to the gate pad disposed in the pad region 16. The gate pad is electrically connected to a gate electrode provided in the cell region 40.

In addition to the gate pad, for example, a current sense pad, a Kelvin emitter pad, a temperature sense diode pad, or the like may be provided in the pad region 16. The current sense pad is a control pad for detecting a current flowing through the cell region 40, and is electrically connected to a part of the cell region 40 so that a current of a fraction of the current flowing through the cell region 40 to a fraction of several tens of thousands flows. The Kelvin emitter pad is electrically connected with the p-type base layer of the IGBT cell. The Kelvin emitter pad and the p-type base layer may be electrically connected via a $p^+$-type contact layer. The temperature sense diode pad is a pair of control pads electrically connected to an anode and a cathode, respectively, of a temperature sense diode provided in the semiconductor device. The temperature of the semiconductor device can be measured by measuring the voltage between the anode and the cathode of the temperature sense diode using the temperature sense diode pad.

FIG. 1 shows an example in which unit cells of an IGBT are arranged in a stripe shape in a plan view in the cell region 40. However, the shape and arrangement of the unit cells are not limited thereto, and for example, unit cells having a shape such as a quadrangle, a hexagon, or a circle may be arranged in a lattice shape.

Figure 2:
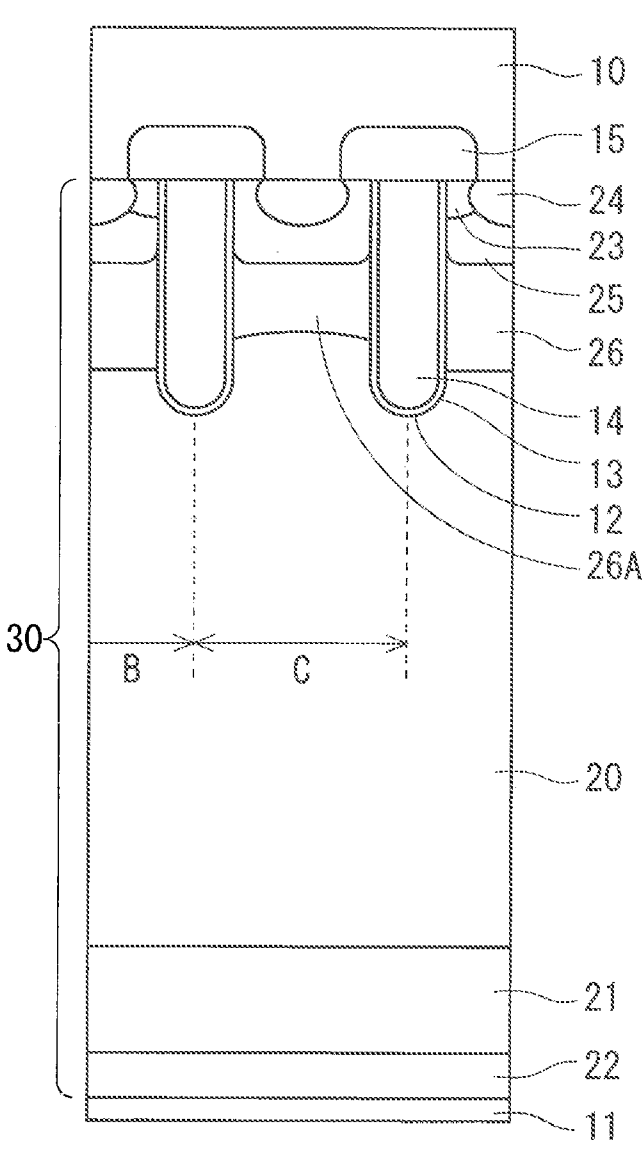
FIG. 2 is a cross-sectional view showing the semiconductor device according to the first preferred embodiment.

FIG. 2 is a cross-sectional view of the semiconductor device according to the first preferred embodiment, and corresponds to a cross section taken along line A1-A2 in FIG. 1. As shown in FIG. 2, the semiconductor device according to the first preferred embodiment is formed using a semiconductor substrate 30. The semiconductor substrate 30 includes silicon (Si), and has a first main surface (upper surface in FIG. 2) as a front surface and a second main surface (lower surface in FIG. 2) as a back surface.

An $n^-$-type drift layer 20 is formed in the semiconductor substrate 30. A p-type base layer 25 is formed in a surface portion of the semiconductor substrate 30 on the first main surface side. An $n^+$-type emitter layer 23 and a $p^+$-type contact layer 24 are selectively formed in a surface portion of the p-type base layer 25. The $p^+$-type contact layer 24 has a higher p-type impurity concentration than the p-type base layer 25.

In the semiconductor substrate 30, a trench 12 that penetrates the p-type base layer 25 and reaches the $n^-$-type drift layer 20 below the p-type base layer 25 is formed. A gate insulating film 13 is formed on the inner surface of the trench 12, and a gate electrode 14 is formed on the gate insulating film 13 so as to be embedded in the trench 12.

Here, a region where the $n^+$-type emitter layer 23 is formed adjacent to the trench 12 is an active region B that functions as an IGBT, and a region where the $n^+$-type emitter layer 23 is not formed adjacent to the trench 12 is a thinned region C that does not function as an IGBT. Note that the $p^+$-type contact layer 24 is formed in both the active region B and the thinned region C.

In the active region B, a first n-type carrier accumulation layer 26 having a higher n-type impurity concentration than the $n^-$-type drift layer 20 is formed as a carrier accumulation layer between the $n^-$-type drift layer 20 and the p-type base layer 25. In the thinned region C, a second n-type carrier accumulation layer 26A having a higher n-type impurity concentration than the $n^-$-type drift layer 20 and a lower n-type impurity concentration than the first n-type carrier accumulation layer 26 is formed as a carrier accumulation layer between the $n^-$-type drift layer 20 and the p-type base layer 25.

By providing the first n-type carrier accumulation layer 26 in the active region B, energization loss when a current flows is reduced. The first n-type carrier accumulation layer 26 and the second n-type carrier accumulation layer 26A are formed by ion-implanting n-type impurities into the semiconductor substrate 30 and diffusing the n-type impurities implanted by annealing into the semiconductor substrate 30.

On the first main surface of the semiconductor substrate 30, an interlayer insulating film 15 is formed so as to cover the upper surface of the gate electrode 14. An emitter electrode 10 is formed on the interlayer insulating film 15. The emitter electrode 10 is electrically connected to the $n^+$-type emitter layer 23 and the $p^+$-type contact layer 24 through a contact hole formed in the interlayer insulating film 15.

Contact holes of the interlayer insulating film 15 are provided in both the active region B and the thinned region C. That is, the $p^+$-type contact layer 24 in the thinned region C has a portion in contact with the emitter electrode 10. For example, as shown in FIG. 3, the contact hole of the thinned region C may have a linear shape (stripe shape) parallel to the trench 12 in plan view, similarly to the contact hole of an active region B. Furthermore, as shown in FIG. 4, the contact hole in thinned region C may have a dot shape in plan view.

As a material of the emitter electrode 10, for example, an aluminum alloy such as an alloy of aluminum and silicon (Al—Si-based alloy) can be used. Furthermore, the emitter electrode 10 may have, for example, a multilayer structure in which a plating film (nickel (Ni) plating film) formed by electroless plating or electrolytic plating is provided on an aluminum alloy. When the width of the contact hole formed in the interlayer insulating film 15 is narrow and good embeddability of the emitter electrode 10 cannot be obtained, a contact electrode including tungsten or the like having more excellent embeddability than the emitter electrode 10 may be formed in the contact hole, and the emitter electrode 10 may be provided on the contact electrode.

Furthermore, a barrier metal in ohmic contact with the $n^+$-type emitter layer 23 and the $p^+$-type contact layer 24 may be formed at the bottom of the contact hole. As the barrier metal, for example, a conductor containing titanium (Ti) (for example, titanium nitride, TiSi obtained by alloying titanium and silicon (Si), or the like) or the like is used.

On the other hand, a p-type collector layer 22 is formed on a surface portion of the semiconductor substrate 30 on the second main surface side. Furthermore, an n-type buffer layer 21 having a higher n-type impurity concentration than the $n^-$-type drift layer 20 is formed between the $n^-$-type drift layer 20 and the p-type collector layer 22. The n-type buffer layer 21 can suppress punch-through of a depletion layer extending from the p-type base layer 25 to the second main surface side when the semiconductor device is in an off state. The n-type buffer layer 21 can be formed, for example, by ion-implanting phosphorus (P) or proton ($H^+$), or both of them into the semiconductor substrate 30. The n-type buffer layer 21 may be omitted.

The p-type collector layer 22 is provided not only in the cell region 40 but also in the termination region, and the p-type termination collector layer is constituted by the p-type collector layer 22 provided in the termination region.

A collector electrode 11 electrically connected to the p-type collector layer 22 in ohmic contact is formed on the second main surface of the semiconductor substrate 30. Similarly to the emitter electrode 10, the collector electrode 11 may be configured by an aluminum alloy or a multilayer structure including an aluminum alloy and a plating film, or may be configured differently from the emitter electrode 10.

Here, effects obtained by the semiconductor device according to the first preferred embodiment will be described in comparison with the comparative example. FIG. 5 is a cross-sectional view showing a semiconductor device according to a comparative example. Furthermore, FIG. 6 is a cross-sectional view showing the semiconductor device according to the first preferred embodiment.

In the semiconductor device of the comparative example shown in FIG. 5, only one type of carrier accumulation layer, that is, only the first n-type carrier accumulation layer 26 is provided. Furthermore, the $n^-$-type emitter layer 23 is adjacent to the trench 12 in which the gate electrode 14 functioning as the gate of the IGBT is disposed, and the $n^+$-type emitter layer 23 is not adjacent to the trench 12 in which the dummy gate electrode 14 not functioning as the gate of the IGBT is disposed. The dummy gate electrode 14 is in contact with the emitter electrode 10 in an unshown region (for example, an end of the trench 12). In this case, Cge of the IGBT tends to increase, and Cgc tends to decrease.

Figure 6:
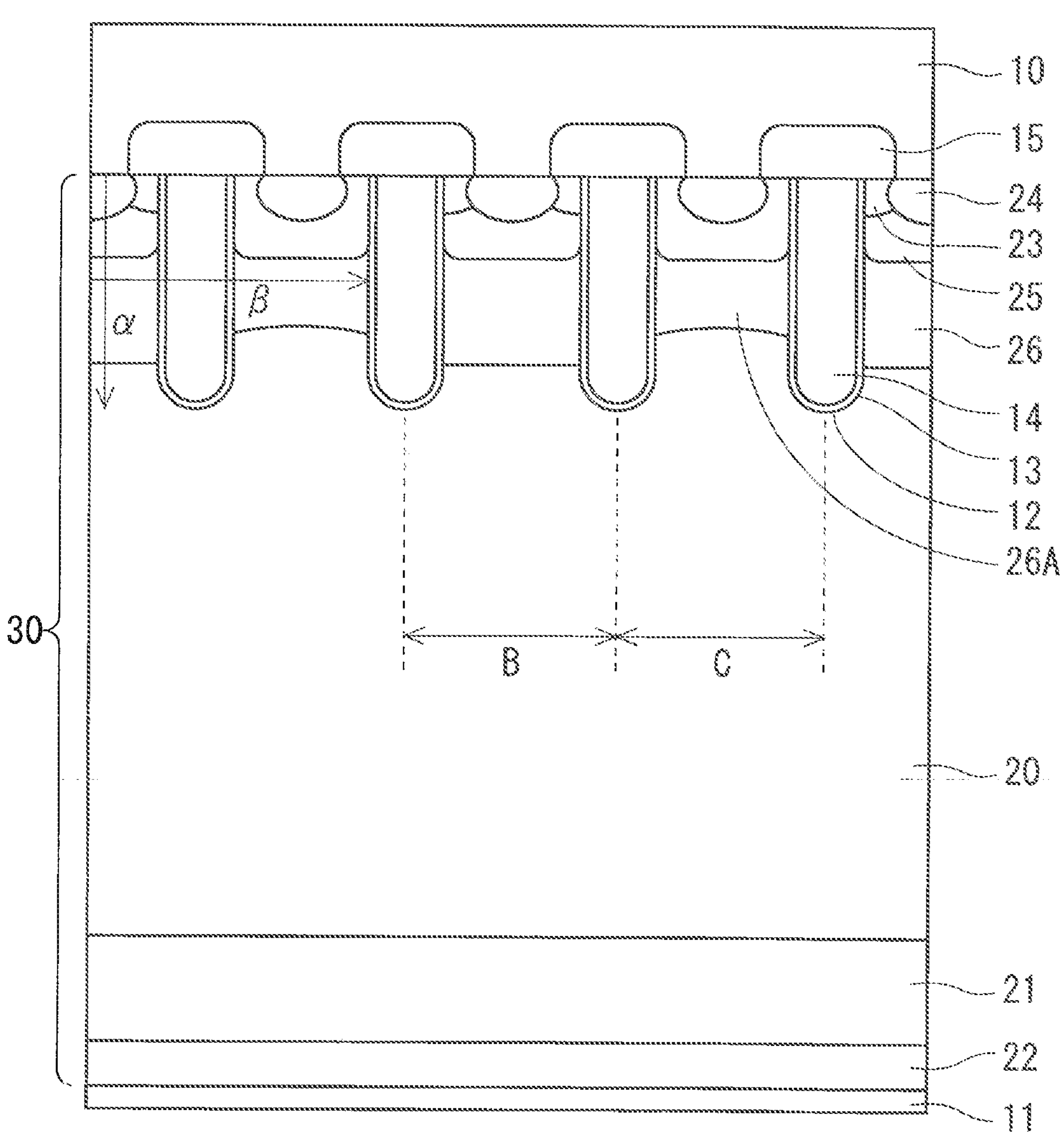
FIG. 6 is a cross-sectional view showing the semiconductor device according to the first preferred embodiment.

On the other hand, in the semiconductor device according to the first preferred embodiment shown in FIG. 6, the first n-type carrier accumulation layer 26 is disposed in the active region B functioning as the IGBT, and the second n-type carrier accumulation layer 26A having a lower impurity concentration than the first n-type carrier accumulation layer 26 is disposed in the thinned region C not functioning as the IGBT. In this case, as compared with the semiconductor device of the comparative example, Cge tends to decrease, and Cgc tends to increase. In the semiconductor device according to the first preferred embodiment, the p-type base layer 25 provided on the second n-type carrier accumulation layer 26A is electrically connected to the emitter electrode 10. As a result, the reverse bias application voltage capability can be secured.

Figure 7:
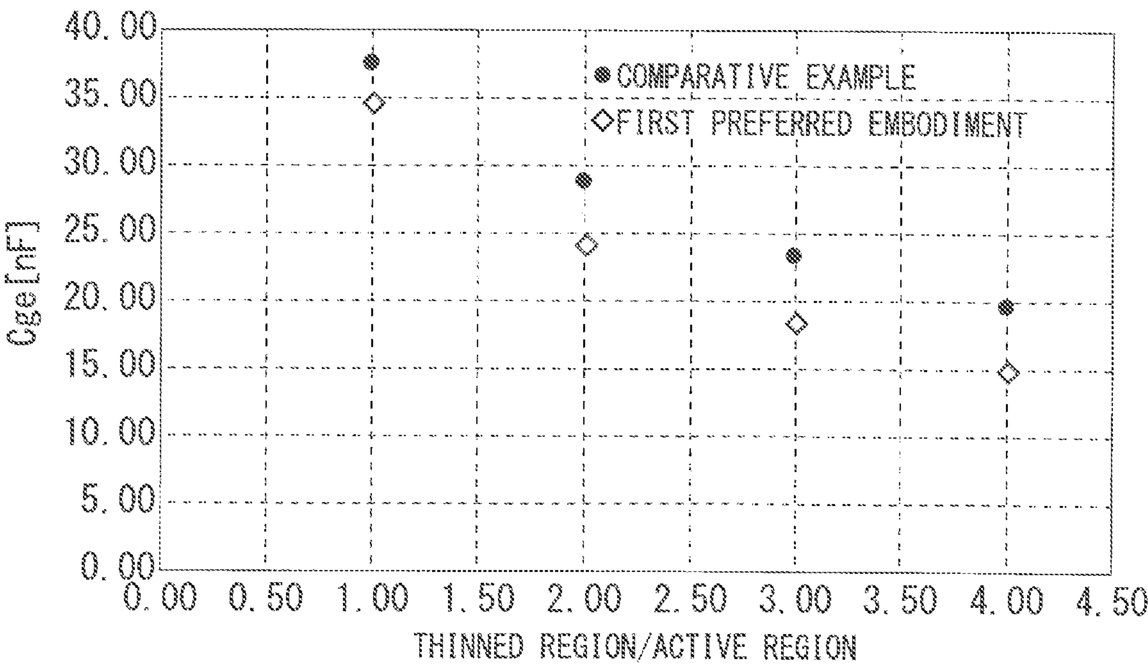
FIG. 7 is a diagram showing a relationship between a ratio between an active region and a thinned region (thinned region/active region) and Cge.

FIG. 7 is a diagram showing a relationship between the ratio between the active region B and the thinned region C (thinned region C/active region B) and the gate-emitter capacitance (Cge) in the semiconductor device of the first preferred embodiment and the semiconductor device of the comparative example. It can be seen that the Cge is lower in the first preferred embodiment than in the comparative example regardless of the ratio between the active region and the thinned region.

FIG. 8 is a diagram showing a relationship between the ratio between the active region B and the thinned region C (thinned region C/active region B) and the gate-collector capacitance (Cge) in the semiconductor device of the first preferred embodiment and the semiconductor device of the comparative example. It can be seen that the Cgc is higher in the first preferred embodiment than in the comparative example regardless of the ratio between the active region and the thinned region.

It can be seen from the results of FIG. 7 and FIG. 8 that the Cgc/Cge becomes higher in the first preferred embodiment than in the comparative example regardless of the ratio between the active region and the thinned region.

FIG. 9 is a diagram showing a relationship between a gate resistance value (Rg) in a turn-on characteristic of an IGBT and dv/dt in a recovery characteristic of a freewheeling diode. In the first preferred embodiment, as compared with the comparative example, it can be confirmed that dv/di in the recovery characteristic of the freewheeling diode tends to be low even if the gate resistance value in the turn-on characteristic of the IGBT is the same. This shows that it is unnecessary to sacrifice the turn-on characteristic of the IGBT in order to suppress dv/dt of the freewheeling diode. In other words, with the same dv/dt as in the comparative example, the turn-on characteristic of the semiconductor device according to the first preferred embodiment becomes more favorable than that of the comparative example.

Figure 10:
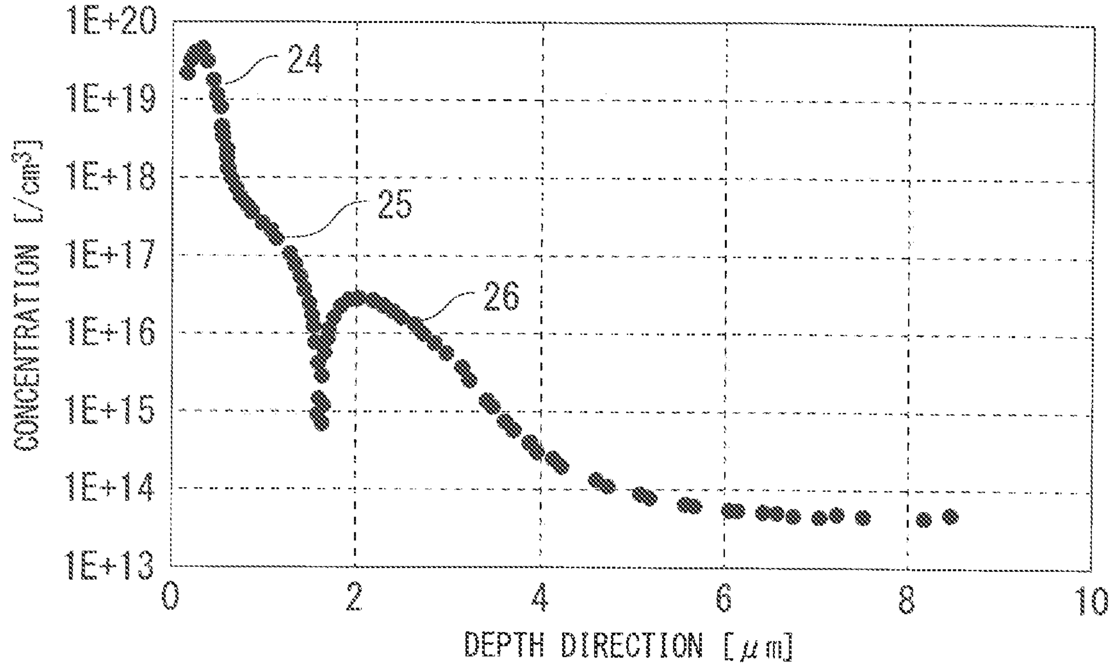
FIG. 10 is a diagram showing a carrier concentration distribution along an direction in FIG. 6.
Figure 11:
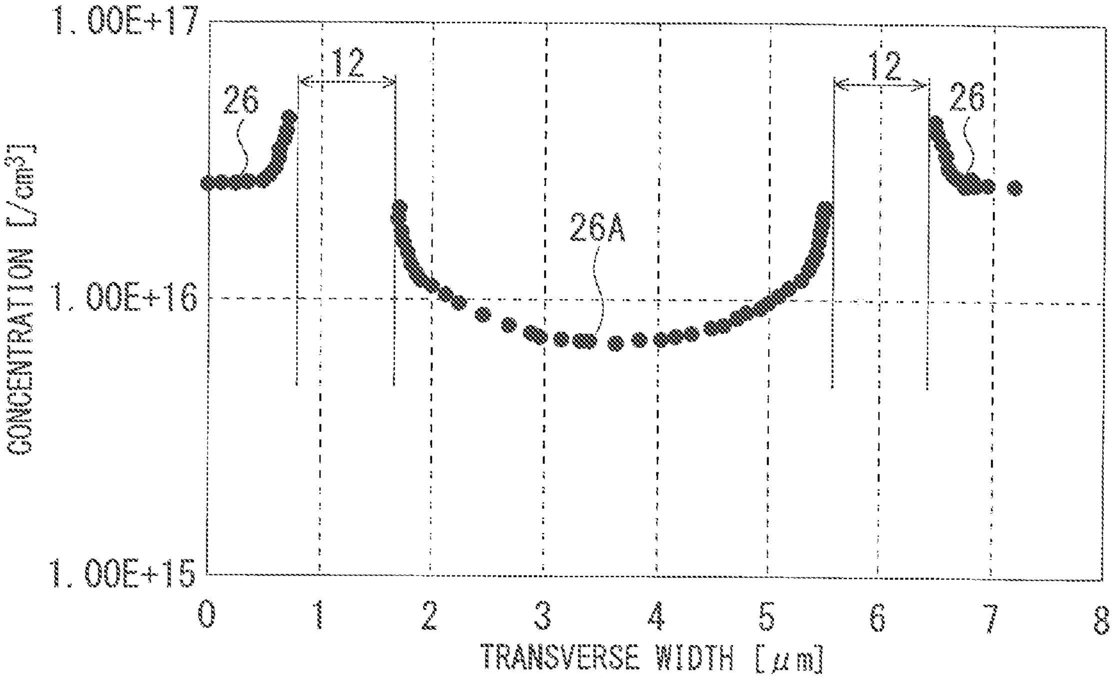
FIG. 11 is a diagram showing a carrier concentration distribution along a ß direction in FIG. 6.

FIG. 10 is a diagram showing a carrier concentration distribution along an a direction in FIG. 6. That is, FIG. 10 shows carrier concentration distributions of the $p^+$-type contact layer 24, the p-type base layer 25, the first n-type carrier accumulation layer 26, and the $n^-$-type drift layer 20 in the active region B in the depth direction of the semiconductor substrate 30. Furthermore, FIG. 11 shows carrier concentration distributions of the first n-type carrier accumulation layer 26 and the second n-type carrier accumulation layer 26A along a β direction in FIG. 6. The carrier concentration distributions of FIG. 11 indicate the carrier concentration distributions at the depth of the semiconductor substrate 30 where the carrier concentration of the first n-type carrier accumulation layer 26 is the highest in FIG. 10. In the carrier concentration distributions of FIG. 11, the carrier concentration of the second n-type carrier accumulation layer 26A is lower than the carrier concentration of the first n-type carrier accumulation layer 26 by 30% or more.

FIG. 12 is a diagram showing a relationship between the ratio between the active region B and the thinned region C (thinned region C/active region B) and the breakdown voltage in the semiconductor device of the first preferred embodiment and the semiconductor device of the comparative example (The breakdown voltage shown in FIG. 12 is a value normalized with reference to the case where the thinned region C/active region Bis 1.). In the comparative example in which the concentration of the second n-type carrier accumulation layer 26A in the thinned region C is not reduced, it can be confirmed that the breakdown voltage is greatly reduced as the ratio between the active region B and the thinned region C (thinned region C/active region B) is increased. In the carrier concentration distribution of FIG. 11, it can be seen that the decrease in the breakdown voltage is suppressed by making the carrier concentration of the second n-type carrier accumulation layer 26A lower than the carrier concentration of the first n-type carrier accumulation layer 26 by 30% or more. In particular, it can be seen that this effect appears when the ratio of the area of the thinned region C to the active region B (thinned region C/active region B) is 1.5 or more.

FIG. 13 is a flowchart showing an example of a method of manufacturing the semiconductor device according to the first preferred embodiment. First, a predetermined pretreatment is performed on the semiconductor substrate 30 before the p-type base layer 25, the first n-type carrier accumulation layer 26, and the second n-type carrier accumulation layer 26A are formed (step S1).

Next, an implantation mask having an opened dopant implantation region is formed using a photolithography technique, and a dopant such as phosphorus or the like is implanted to form the first n-type carrier accumulation layer 26 and the second n-type carrier accumulation layer 26A (step S2). In addition, an implantation mask having an opened dopant implantation region is formed using a photolithography technique, and a dopant such as phosphorus or the like is implanted to form the p-type base layer 25 (step S3). Thereafter, impurities in the p-type base layer 25, the first n-type carrier accumulation layer 26, and the second n-type carrier accumulation layer 26A are diffused by heat treatment (step S4).

Thereafter, a formation process of the $n^+$-type emitter layer 23 (step S5), a formation process of the trench 12 (step S6), a formation process of the gate insulating film 13 (step S7), a formation process of the gate electrode 14 (step S8), a formation process of the $p^+$-type contact layer 24 (step S9), and a formation process of the interlayer insulating film 15 and the contact hole (step S10) are sequentially performed, and a barrier metal is formed at the bottom of the contact hole as necessary (step S11). Then, a formation process of the emitter electrode 10 (step S12) and a thinning process of the semiconductor substrate 30 (step S13) are performed. Finally, back surface structures such as the n-type buffer layer 21, the p-type collector layer 22, and the collector electrode 11 are formed on the second main surface side of the semiconductor substrate 30 (step S14), and the semiconductor device according to the first preferred embodiment is completed.

Note that, either the formation process of the p-type base layer 25 (step S2) or the formation process of the first n-type carrier accumulation layer 26 and the second n-type carrier accumulation layer 26A (step S3) may be performed first. Furthermore, in the formation process (step S2) of the first n-type carrier accumulation layer 26 and the second n-type carrier accumulation layer 26A, in order to further lower the impurity concentration of the second n-type carrier accumulation layer 26A, a process of depositing an oxide film or the like on the thinned region C may be added before the formation of the implantation mask.

As described above, according to the semiconductor device of the first preferred embodiment, it is possible to suppress the decrease in Cgc/Cge while suppressing the deterioration of the turn-on characteristics and the withstand voltage characteristics of the IGBT.

Second Preferred Embodiment

Figure 14:
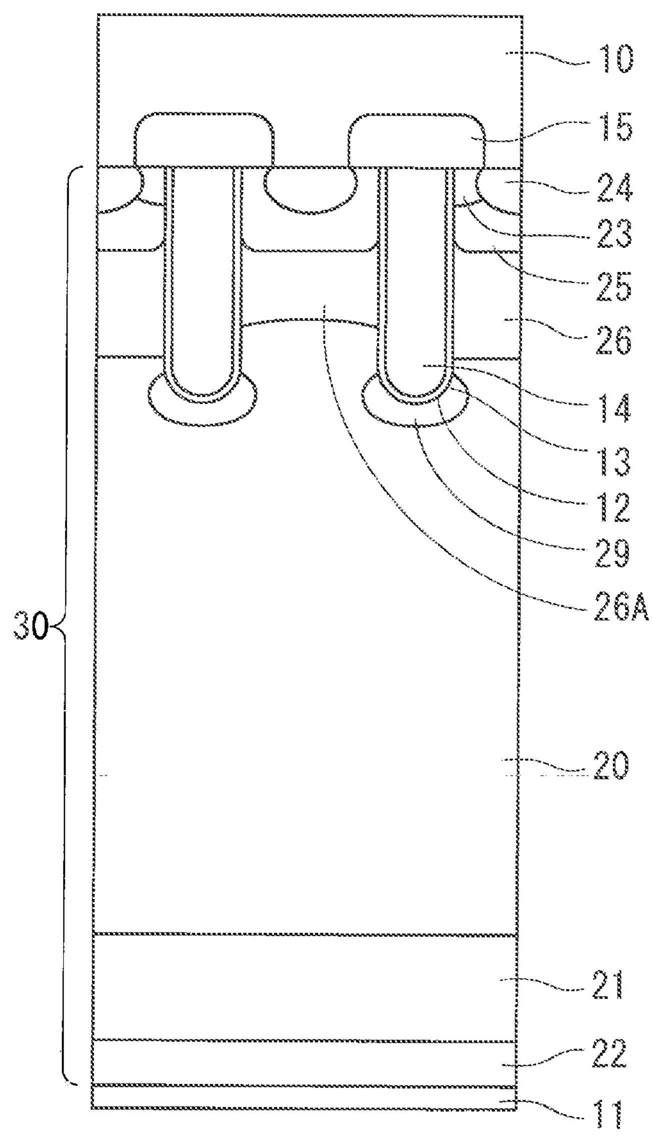
FIG. 14 is a diagram showing a configuration of a semiconductor device according to a second preferred embodiment.

FIG. 14 is a diagram showing a configuration of a semiconductor device according to a second preferred embodiment. The configuration of the semiconductor device of FIG. 14 is different from the configuration of the first preferred embodiment (FIG. 2) in that a bottom p-type layer 29 is provided in the $n^-$-type drift layer 20 at the bottom of the trench 12. That is, the bottom p-type layer 29 is provided between the bottom of the trench 12 and the $n^-$-type drift layer 20.

According to the semiconductor device of the second preferred embodiment, in addition to the effect of the first preferred embodiment, the effect that the bottom p-type layer 29 suppresses the electric field generated at the bottom of the trench 12 at the time of switching is obtained, and the interruption tolerance can be improved.

Third Preferred Embodiment

Figure 15:
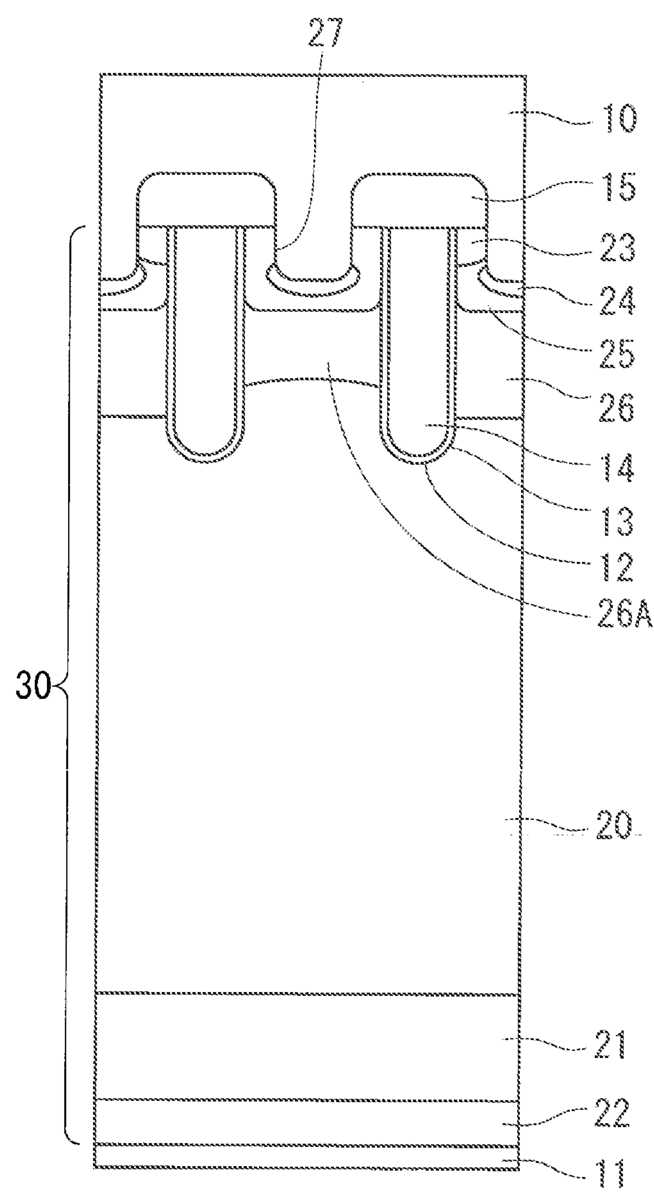
FIG. 15 is a diagram showing a configuration of a semiconductor device according to a third preferred embodiment.

FIG. 15 is a diagram showing a configuration of a semiconductor device according to a third preferred embodiment. The configuration of the semiconductor device of FIG. 15 is different from the configuration of the first preferred embodiment (FIG. 2) in that a contact trench 27 is provided in a formation region of the $p^+$-type contact layer 24 on the first main surface of the semiconductor substrate 30. Therefore, the $p^+$-type contact layer 24 is formed at the bottom of the contact trench 27. The contact trench 27 is formed at a position corresponding to the contact hole of the interlayer insulating film 15, and the emitter electrode 10 is embedded in the contact trench 27.

According to the semiconductor device of the third preferred embodiment, in addition to the effect of the first preferred embodiment, the collector current does not pass immediately below the $n^+$-type emitter layer 23 but flows through the contact trench 27 during the switching of the IGBT, so that an effect of improving the latch-up tolerance can be obtained.

Fourth Preferred Embodiment

FIG. 16 is a diagram showing a configuration of a semiconductor device according to a fourth preferred embodiment. The configuration of the semiconductor device of FIG. 16 is different from the configuration of the first preferred embodiment (FIG. 2) in that an n-type cathode layer 28 is selectively provided in a surface portion of the semiconductor substrate 30 on the second main surface side. The collector electrode 11 is electrically connected to both the p-type collector layer 22 and the n-type cathode layer 28. With this configuration, the IGBT region and the diode region are formed in the cell region 40.

That is, the semiconductor device according to the fourth preferred embodiment is a so-called reverse conducting IGBT (RC-IGBT) in which an IGBT and a freewheeling diode (FWD) are formed on the same semiconductor substrate 30. As described above, the technology of the present disclosure is also applicable to an RC-IGBT.

Note that the preferred embodiments can be freely combined, and the preferred embodiments can be appropriately modified or omitted.

APPENDICES

Hereinafter, various aspects of the present disclosure will be collectively described as appendices.

Appendix 1

A semiconductor device comprising:

a semiconductor substrate having a first main surface and a second main surface opposite to the first main surface;

a drift layer of a first conductivity type provided between the first main surface and the second main surface of the semiconductor substrate;

a base layer of a second conductivity type provided in a surface portion of the semiconductor substrate on the first main surface side;

a carrier accumulation layer of the first conductivity type provided between the base layer and the drift layer and having a higher impurity concentration than the drift layer;

an emitter layer of the first conductivity type selectively provided in a surface portion of the base layer on the first main surface side;

a contact layer of the second conductivity type selectively provided in the surface portion of the base layer on the first main surface side and having a higher impurity concentration than the base layer;

a trench formed in the first main surface of the semiconductor substrate and penetrating the base layer and the carrier accumulation layer to reach the drift layer;

a gate insulating film provided in an inner surface of the trench;

a gate electrode provided on the gate insulating film and embedded in the trench;

an emitter electrode provided on the first main surface of the semiconductor substrate and electrically connected to the emitter layer and the contact layer;

a collector layer of the second conductivity type provided in a surface portion of the semiconductor substrate on the second main surface side;

a collector electrode provided on the second main surface of the semiconductor substrate and electrically connected to the collector layer;

an active region that is a region where the emitter layer is provided adjacent to the trench; and a thinned region that is a region where the emitter layer is not provided adjacent to the trench, wherein the active region includes a first carrier accumulation layer as the carrier accumulation layer, the thinned region includes a second carrier accumulation layer having a lower impurity concentration than the first carrier accumulation layer as the carrier accumulation layer, and the contact layer in the thinned region has a portion in contact with the emitter electrode.

Appendix 2

The semiconductor device according to Appendix 1, wherein a ratio of an area of the thinned region to the active region is 1.5 or more, and at a depth of the semiconductor substrate where a carrier concentration of the first carrier accumulation layer is highest, a carrier concentration of the second carrier accumulation layer is lower than a carrier concentration of the first carrier accumulation layer by 30% or more.

Appendix 3

The semiconductor device according to Appendix 1 or 2, further comprising a bottom layer of the second conductivity type provided in the drift layer at a bottom of the trench.

Appendix 4

The semiconductor device according to any one of Appendices 1 to 3, wherein the contact layer is formed at a bottom of a contact trench provided in the first main surface of the semiconductor substrate.

Appendix 5

The semiconductor device according to any one of Appendices 1 to 4, further comprising a cathode layer of the first conductivity type selectively provided in a surface portion of the semiconductor substrate on the second main surface side, wherein the collector electrode is electrically connected to both the collector layer and the cathode layer.

Appendix 6

The semiconductor device according to any one of Appendices 1 to 5, wherein the emitter electrode is provided on an interlayer insulating film provided on the first main surface of the semiconductor substrate, and is connected to the emitter layer and the contact layer through a contact hole formed in the interlayer insulating film, and the contact hole in the thinned region has a linear shape extending in parallel with the trench in plan view.

Appendix 7

The semiconductor device according to any one of Appendices 1 to 5, wherein the emitter electrode is formed on an interlayer insulating film provided on the first main surface of the semiconductor substrate, and is connected to the emitter layer and the contact layer through a contact hole formed in the interlayer insulating film, and the contact hole in the thinned region has a dot shape in plan view.

While the disclosure has been shown and described in detail, the foregoing description is in all aspects illustrative and not restrictive. It is therefore understood that numerous modifications and variations can be devised.

What is claimed is:

1. A semiconductor device comprising:

a semiconductor substrate having a first main surface and a second main surface opposite to the first main surface;

a drift layer of a first conductivity type provided between the first main surface and the second main surface of the semiconductor substrate;

a base layer of a second conductivity type provided in a surface portion of the semiconductor substrate on the first main surface side;

a carrier accumulation layer of the first conductivity type provided between the base layer and the drift layer and having a higher impurity concentration than the drift layer;

an emitter layer of the first conductivity type selectively provided in a surface portion of the base layer on the first main surface side;

a contact layer of the second conductivity type selectively provided in the surface portion of the base layer on the first main surface side and having a higher impurity concentration than the base layer;

a trench formed in the first main surface of the semiconductor substrate and penetrating the base layer and the carrier accumulation layer to reach the drift layer;

a gate insulating film provided in an inner surface of the trench;

a gate electrode provided on the gate insulating film and embedded in the trench;

an emitter electrode provided on the first main surface of the semiconductor substrate and electrically connected to the emitter layer and the contact layer;

a collector layer of the second conductivity type provided in a surface portion of the semiconductor substrate on the second main surface side;

a collector electrode provided on the second main surface of the semiconductor substrate and electrically connected to the collector layer;

an active region that is a region where the emitter layer is provided adjacent to the trench; and a thinned region that is a region where the emitter layer is not provided adjacent to the trench, wherein the active region includes a first carrier accumulation layer as the carrier accumulation layer, the thinned region includes a second carrier accumulation layer having a lower impurity concentration than the first carrier accumulation layer as the carrier accumulation layer, and the contact layer in the thinned region has a portion in contact with the emitter electrode.

2. The semiconductor device according to claim 1, wherein a ratio of an area of the thinned region to the active region is 1.5 or more, and at a depth of the semiconductor substrate where a carrier concentration of the first carrier accumulation layer is highest, a carrier concentration of the second carrier accumulation layer is lower than a carrier concentration of the first carrier accumulation layer by 30% or more.

3. The semiconductor device according to claim 1, further comprising a bottom layer of the second conductivity type provided in the drift layer at a bottom of the trench.

4. The semiconductor device according to claim 1, wherein the contact layer is formed at a bottom of a contact trench provided in the first main surface of the semiconductor substrate.

5. The semiconductor device according to claim 1, further comprising a cathode layer of the first conductivity type selectively provided in a surface portion of the semiconductor substrate on the second main surface side, wherein the collector electrode is electrically connected to both the collector layer and the cathode layer.

6. The semiconductor device according to claim 1, wherein the emitter electrode is provided on an interlayer insulating film provided on the first main surface of the semiconductor substrate, and is connected to the emitter layer and the contact layer through a contact hole formed in the interlayer insulating film, and the contact hole in the thinned region has a linear shape extending in parallel with the trench in plan view.

7. The semiconductor device according to claim 1, wherein the emitter electrode is formed on an interlayer insulating film provided on the first main surface of the semiconductor substrate, and is connected to the emitter layer and the contact layer through a contact hole formed in the interlayer insulating film, and the contact hole in the thinned region has a dot shape in plan view.

* * * * *